US012733125B2

(12) United States Patent
Cook

(10) Patent No.: US 12,733,125 B2
(45) Date of Patent: Sep. 8, 2026

(54) MODULAR WIRELESS CHARGING TRANSMITTER ASSEMBLY SYSTEM

(71) Applicant: Aptiv Technologies AG, Schaffhausen (CH)

(72) Inventor: James Cook, Poland, OH (US)

(73) Assignee: Aptiv Technologies AG, Schaffhausen (CH)

(*) Notice: Subject to any disclaimer, the term of this patent is extended or adjusted under 35 U.S.C. 154(b) by 244 days.

(21) Appl. No.: 18/374,795

(22) Filed: Sep. 29, 2023

(65) Prior Publication Data

US 2024/0022115 A1 Jan. 18, 2024

Related U.S. Application Data

(63) Continuation of application No. 17/721,975, filed on Apr. 15, 2022, now Pat. No. 11,811,239.
(Continued)

(51) Int. Cl.
*H02J 50/10* (2016.01)
*H02J 7/70* (2026.01)
(Continued)

(52) U.S. Cl.
CPC ............ *H05K 7/20136* (2013.01); *H02J 7/70* (2026.01); *H02J 50/10* (2016.02); *H02J 50/402* (2020.01);
(Continued)

(58) Field of Classification Search
CPC ........ H02J 50/10; H02J 50/005; H02J 7/0042; H02J 50/12; H02J 50/402; H02J 7/00309;
(Continued)

(56) References Cited

U.S. PATENT DOCUMENTS 11,231,730 B1 1/2022 King et al.
2005/0068019 A1* 3/2005 Nakamura ................ G06F 1/26 323/355
(Continued)

FOREIGN PATENT DOCUMENTS

CN 104485759 A 4/2015
CN 204800591 U 11/2015
(Continued)

OTHER PUBLICATIONS

DE 102018201300 english translation (Year: 2018).*
(Continued)

*Primary Examiner* — Mandeep S Buttar
(74) *Attorney, Agent, or Firm* — Billion & Armitage

(57) ABSTRACT

An electronics module is configured to provide power to one of a plurality of different types of coil modules utilized for wireless charging. The electronics module includes an input power interface configured to receive direct current (DC) power, a DC-to-AC converter circuitry configured to convert the DC power to alternating current (AC) power, and an output power interface having a first set of output pins and at least a second set of output pins configured to interface with each of the plurality of different types of coil modules, wherein AC power is selectively provided to the first set of output pins, or both the first and second set of output pins based on a type of coil module connected to the electronics module.

20 Claims, 5 Drawing Sheets

Related U.S. Application Data

(60) Provisional application No. 63/293,957, filed on Dec. 27, 2021, provisional application No. 63/175,900, filed on Apr. 16, 2021.

(51) Int. Cl.

*H02J 50/40* (2016.01)
*H04B 5/26* (2024.01)
*H04B 5/79* (2024.01)
*H05K 7/20* (2006.01)

(52) U.S. Cl.

CPC ................. *H04B 5/26* (2024.01); *H04B 5/79* (2024.01); *H05K 7/20145* (2013.01); *H05K 7/20209* (2013.01); *H05K 7/20909* (2013.01); *H02J 2207/20* (2020.01)

(58) Field of Classification Search

CPC ................ H02J 50/40; H02J 7/007192; H05K 7/20136; H05K 7/20145; H05K 7/20909; H05K 7/20172; H05K 7/20272; H05K 7/1427; H01F 38/14; H01F 27/02; H01F 27/085; H01F 27/025; H01F 27/08; G06F 1/20

USPC .......................................................... 361/695

See application file for complete search history.

(56) References Cited

U.S. PATENT DOCUMENTS

2011/0018360 A1 1/2011 Baarman et al.
2011/0157939 A1 6/2011 Wang et al.
2014/0347005 A1 11/2014 Zhou et al.
2015/0008876 A1 1/2015 Kwak et al.
2015/0357863 A1 12/2015 Sadakata et al.
2017/0047769 A1* 2/2017 Kim ........................ H02J 50/80
2017/0047852 A1 2/2017 Huang et al.
2018/0062430 A1 3/2018 Matsumoto et al.
2018/0097315 A1 4/2018 Guo
2018/0294681 A1 10/2018 Bae
2018/0351414 A1* 12/2018 Park ........................ H02J 50/12
2020/0091836 A1 3/2020 Lee et al.
2021/0161034 A1* 5/2021 Jeong .................... H02J 50/005

FOREIGN PATENT DOCUMENTS

CN 105846550 A 8/2016
CN 209168921 U 7/2019
DE 102018201300 A1 * 8/2019 ............. B60R 16/03

OTHER PUBLICATIONS

"Communication Pursuant to EPC Rule 69 Mailed on Oct. 24, 2022", 2 Pages.
"Extended European Search Report mailed on Sep. 13, 2022", 6 pages.
"Office Action for Application No. 202210404802.3; mailed on Jan. 26, 2026", 24 Pages.

* cited by examiner

202
Magsafe coil module
204
Qi/Magsafe Charging Electronics Base Module
200
Qi coil module 202
210
212
214
204
Magsafe coil module
Qi/Magsafe Charging Electronics Module 200
206
208
204
Qi coil module
Qi/Magsafe Charging Electronics Module

MODULAR WIRELESS CHARGING TRANSMITTER ASSEMBLY SYSTEM

CROSS REFERENCE TO RELATED APPLICATION(S)

This patent application is a continuation application of U.S. application Ser. No. 17/721,975, filed Apr. 15,2022, which claims the benefit of U.S. Provisional Application No. 63/175,900, filed Apr. 16, 2021, and U.S. Provisional Application No. 63/293,957, filed Dec. 27,2021, both of which are incorporated by reference in their entirety.

BACKGROUND

The disclosure is directed to wireless charging systems and in particular to modular wireless charging transmitter assembly systems.

In general there are two approaches to wireless charging. The first system allows for freedom of positioning the wireless charging receiver (e.g., phone) on the wireless charging transmitter. The wireless charging transmitter is characterized by a large charging area that accommodates various placements of the wireless charging receiver. The second system utilizes a magnetic interface system that precisely aligns the wireless charging receiver (e.g., phone) with the wireless charging transmitter.

Wireless charging receivers utilizing the magnetic interface system to align with the wireless charging transmitter may work with non-magnetic wireless charging transmitters, but interoperability between the two create some problems, including poor efficiency, excess heat generation, and other issues.

For automotive manufacturers and others, selecting a particular type of wireless charging transmitter that subsequently differs from the type of wireless charging receiver utilized by a user limits the usefulness and convenience of the wireless charging transmitter. It would therefore be beneficial to develop a wireless charging transmitter system that can accommodate both types of charging systems.

SUMMARY OF THE INVENTION

According to one aspect, an electronics module is configured to provide power to one of a plurality of different types of coil modules utilized for wireless charging. The electronics module includes an input power interface configured to receive direct current (DC) power, a DC-to-AC converter circuity configured to convert the DC power to alternating current (AC) power, and an output power interface having a first set of output pins and at least a second set of output pins configured to interface with each of the plurality of different types of coil modules, wherein AC power is selectively provided to the first set of output pins, or both the first and second set of output pins based on a type of coil module connected to the electronics module.

According to another aspect, a modular wireless charging transmitter assembly system is provided that includes an electronics module and one of a first type of coil module or a second type of coil module. The electronics module includes a module input power interface configured to receive direct current (DC) power, a DC-to-AC converter circuity configured to convert the DC power to alternating current (AC) power, and an output power interface having a first set of output pins and at least a second set of output pins, wherein AC power is selectively provided to the first set of output pins, or both the first and second set of output pins based on a type of coil module connected to the electronics module. In addition, each of the first and second type of coil module includes a coil input interface configured to connect to the output power interface to receive AC power from the electronics module.

According to another aspect, a modular wireless charging system is configured to provide power to one of a plurality of different types of coil modules utilized for wireless charging. The system includes an electronics module that includes a housing body having a top surface for receiving one of a plurality of different types of coil modules. The electronics module further includes input terminals for receiving direct current (DC) power and a plurality of output terminals for selectively providing alternating current (AC) power to one or more of the plurality of output terminals based on a type of coil module connected to the electronics module via the top surface of the housing body, wherein AC power delivered to the coil module provides wireless charging of electronic devices. The at least one coil module includes a bottom surface configured to be placed on the top surface of the housing body and having at least one coil configured to receive AC power from the electronics module.

DETAILED DESCRIPTION

Disclosed herein is a modular wireless charging transmitter assembly system. In general, the modular wireless charging transmitter assembly system includes an electronics module configured for connection to a plurality of different transmitter coil modules (referred to generically as the "coil modules"). The plurality of different types of coil modules are interchangeable and share an interface for mounting the coil modules onto the common or generic electronics modules.

Figures 1, 2, 3:
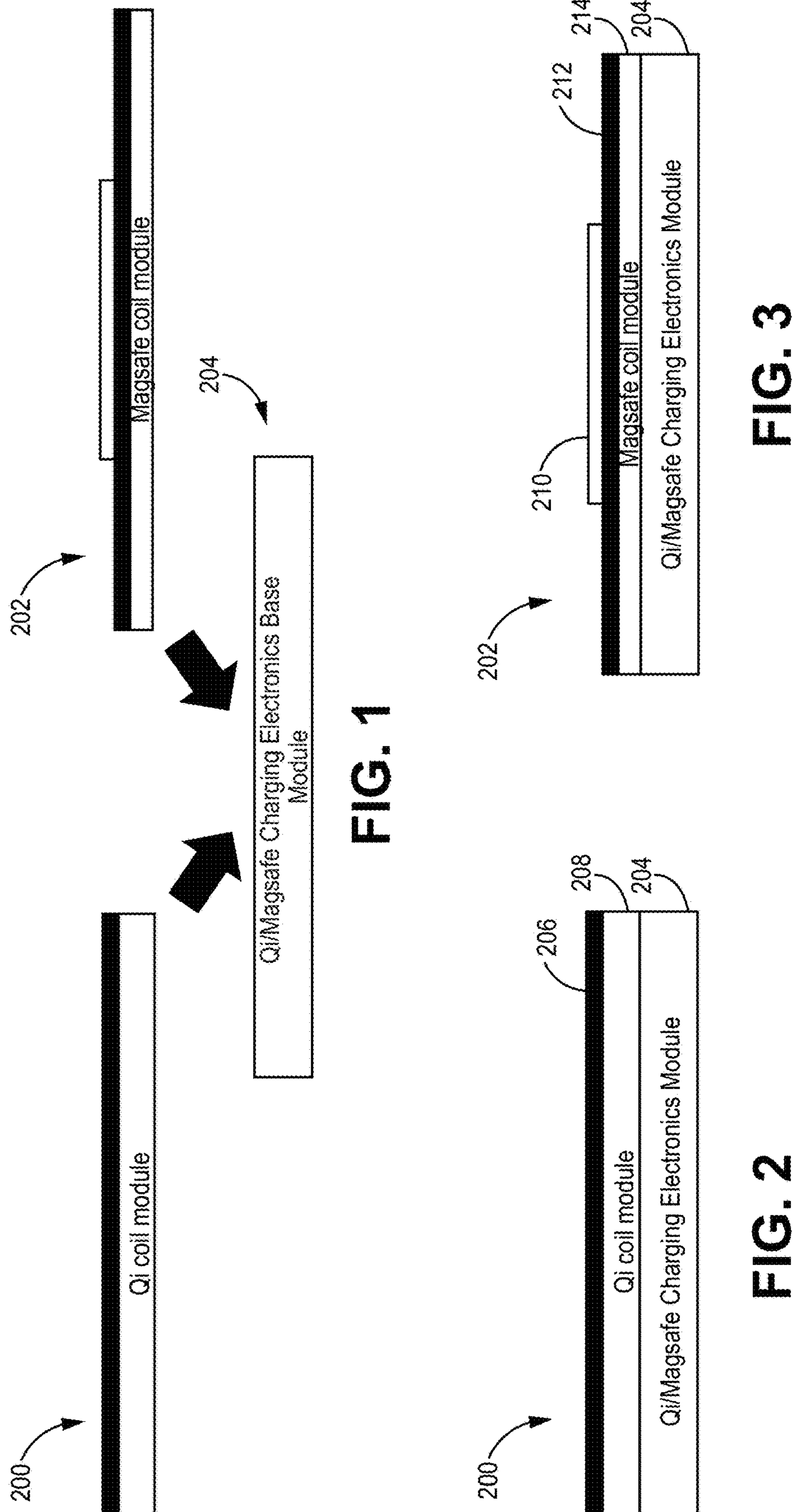
FIG. 1 is a side view of a modular wireless charging transmitter that includes a modular large area wireless charging transmitter and a modular magnetic wireless charging transmitter configured for selective connection to the electronic base charging module according to some embodiments.
FIG. 2 is a side view of a modular large area wireless charging transmitter mounted on an electronic base according to some embodiments.
FIG. 3 is a side view of a modular magnetic wireless charging transmitter mounted on an electronic base according to some embodiments.

FIG. 1 is a side view of a modular wireless charging transmitter system that includes a first type of wireless charging coil module (e.g., a Qi-type coil module) 200 and a modular magnetic wireless charging coil ("MagSafe® coil module") 202 configured for selective connection to the electronic base charging module ("electronics module") 204 according to some embodiments. The electronics module 204 contains the electronic components required for energizing the wireless charging coil and any other components required to perform the functions required by the wireless charging transmitter assembly. In some embodiments, electronics module 204 includes one or more of inverters, power supplies, DC-to-DC converters, and matching networks to convert the DC power provided by the vehicle (e.g., automobile) to AC power supplied to the coil modules (200 or 202). In some embodiments, the electronics module 204 configures these components based on the coil module (200 or 202) connected to the electronics module 204. For example, in some embodiments the matching network presented to the coil module may be selected based on the coil module mounted to the electronics module 204. As described in more detail below, in some embodiments this requires the electronics module 204 to detect or otherwise determine the type of coil module connected. These components are enclosed in a housing that may also include mounting features that could interface with a vehicle mounting system or other end-use mounting system. In some embodiments, the housing includes air ducting for active cooling of the transmitter coil module and/or the wireless charging receiver.

In some embodiments, the "coil module" contains the wireless charging coil or coils, high permeability magnetic shielding, and possibly other components such as NFC antenna, cellular coupling antenna, e-field shielding, and/or matching network enclosed within a housing that may also include the top surface that would contact the wireless charging receiver. In some embodiments, the Qi-type coil module 200 may be comprised of a plurality of coils (e.g., three) arranged to provide a large charging area. In contrast, the MagSafe® coil module 202 may utilize only a single coil. The different types of coil modules may likewise present different matching networks. As discussed above, in some embodiments it may be beneficial for electronics module 204 to be capable of selectively altering the matching network presented by the electronics module 204 based on which of the coil modules (200 or 202) is connected. In some embodiments, the coil module also includes air ducting configured to interact with the air ducting provided by the electronics module 204 to provide active cooling of the coil module or wireless charging receiver. In some embodiments the electronics module 204 is mounted or otherwise fixedly attached within the interior of a vehicle.

Figure 6:
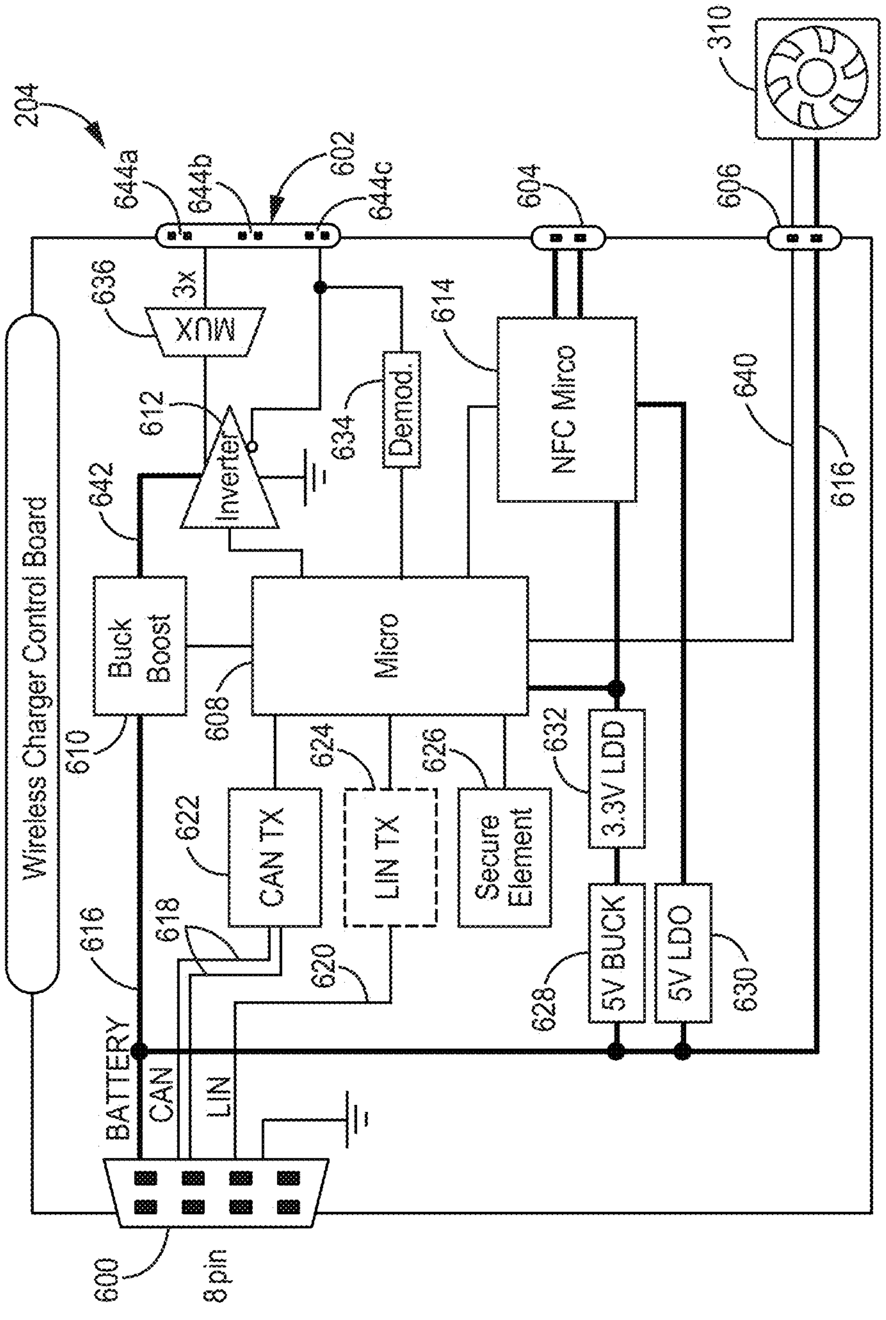
FIG. 6 is a circuit diagram of electrical components housed within the electronics module according to some embodiments.
Figures 7A, 7B:
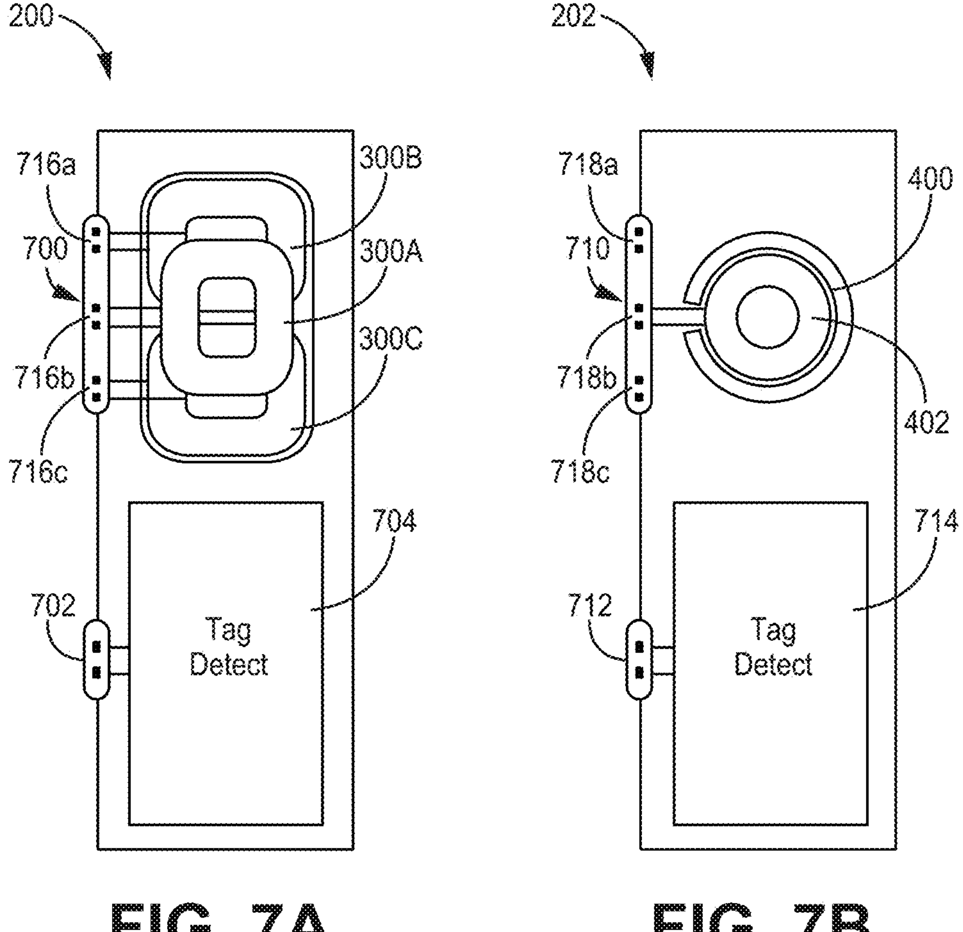
FIGS. 7A and 7B are circuit diagrams of electrical connections associated with Qi-type coil module and MagSafe® coil module, respectively, according to some embodiments.

The Qi coil module 200 or MagSafe® coil module 202 may be selectively mounted onto the electronics module 204 as desired. For example, a user could have both the Qi coil module 200 and the MagSafe® coil module 202, and based on the type of device to be charged may selectively attached the desired coil module onto the electronics base 204. In some embodiments, a latching mechanism is utilized to attach the respective coil module to the electronics module 204. In some embodiments, the electronics module 204 includes an interface for interfacing with both the Qi coil module 200 and the MagSafe® coil module 202. In some embodiments, the interface is utilized to transmit power from the electronics module 204 to the respective coils located within Qi coil module 200 and/or MagSafe® coil module 202. In some embodiments, the interface is also utilized to transmit communications between the electronics module 204 and the respective coil module 200 or 202. For example, FIG. 6 illustrates examples of various terminals/interfaces located on the electronics module 204 and FIGS. 7A-7B illustrate terminals/interfaces located on the respective coil modules 200 and 202. In some embodiments, the interface includes a pogo pin style interface, with copper pads on one part and spring pins on the other part. In other embodiments, the interface includes a pin-header style, wherein the connector housing may be integral to the plastic housing of the modules. In some embodiments, the connection interface may be able to support a large number of mating cycles with minimal change in performance. In some embodiments, the electrical connection interface may be designed to pivot during assembly/disassembly.

In some embodiments, the interface may also include a verification interface utilized to identify the type of coil module attached to the electronics module 204. For example, the verification interface may consist of exposed copper printed circuit board (PCB) patterns (like those used for push-buttons) on either the electronics module 204, the respective coil modules 200 or 202, or both modules, in combination with electrically conductive material on the mating part that, upon connecting the coil module (either 200 or 202) to electronics module 204, shorts the separate contacts in the PCB pattern. The connection made across the PCB pattern is detected by the electronics module 204 and utilized to determine the coil module (e.g., Qi coil module 200 and/or MagSafe® coil module 202) connected. As discussed above, based on the type of coil module connected, the electronics module 204 may modify one or more parameters (e.g., matching network) in order to maximize efficiency and operation.

FIG. 2 is a side view of a Qi-type coil module 200 mounted to an electronics module 204. In this embodiment, the geometry of the Qi-type coil module 200 is selected to have approximately the same dimensions as the electronics module 204. In some embodiments, the Qi-type coil module 200 includes a rubberized surface 206 for placement of an electronic device (e.g., phone).

FIG. 3 is a side view of a MagSafe® coil module 202 mounted to the electronics module 204. As shown in FIG. 3, the MagSafe® coil module 202 includes an elevated portion 210, a rubberized portion 212, and housing portion 214. Magnets (not shown) included in the elevated portion 210 ensure that the electronic device is precisely located adjacent the elevated portion 210. The electronics modules 204 remains the same in the embodiments shown in FIGS. 2 and 3. That is, electronics module 204 is configured to connect to either the Qi-type coil module 200 or the MagSafe® coil module 202.

Figure 4A:
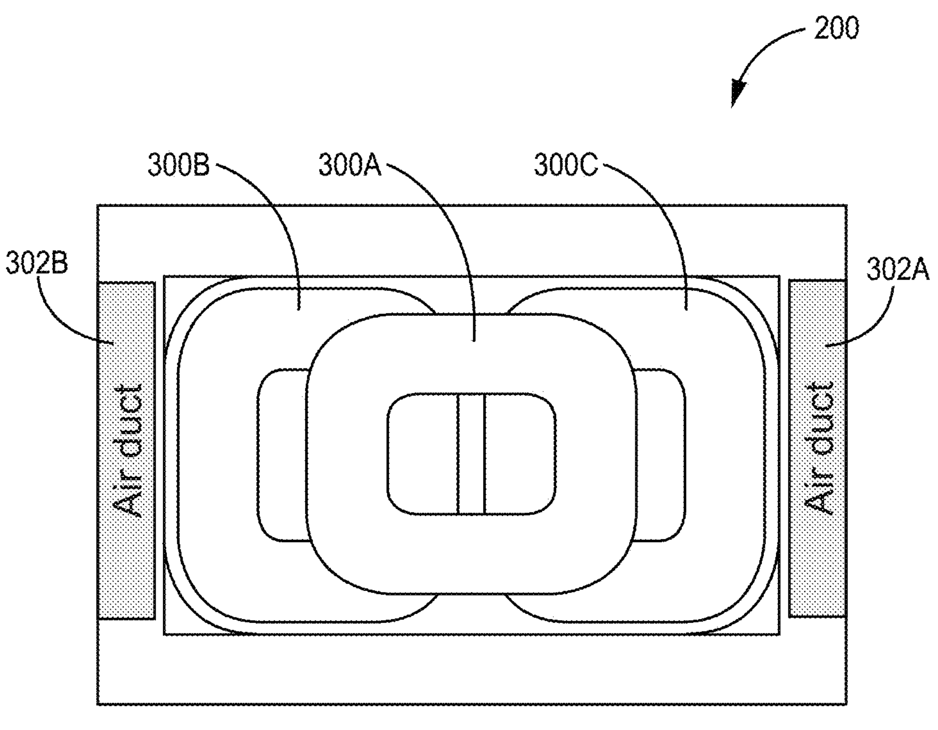
FIG. 4A is a top view of a modular large area wireless charging transmitter with cooling vents according to some embodiments.
Figure 4B:
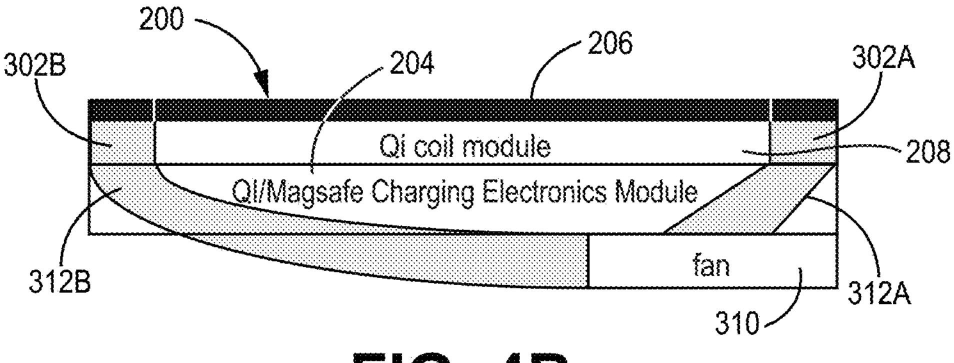
FIG. 4B is a side view of a modular large area wireless charging transmitter with cooling vents according to some embodiments.

FIG. 4A is a top view of a Qi-type coil module 200 and FIG. 4B is a side view of the Qi-type coil module 200 mounted on the electronics module 204. In the embodiment shown in FIG. 4A, Qi-type coil module 200 includes first coil 300*a*, second coil 300*b*, and third coil 300*c*. The inclusion of a plurality of coils (e.g., three) ensures that placement of an electronic device (e.g., phone) anywhere on the Qi-type coil module 200 will result in charging.

As shown in FIG. 4A, cooling ducts 302*a* and 302*b* are positioned on opposite sides of the plurality of coils 300*a*, 300*b*, and 300*c*. As shown in FIG. 4B, a fan 310 is positioned on adjacent to the electronics module 204 and configured to provide cooling airflow through cooling ducts

312*a*, 312*b* (included within electronics module 204) to cooling ducts 302*a*, 302*b* (included within Qi-type coil module 200. In particular, in the embodiment shown in FIGS. 4A and 4B, the electronics module 204 includes cooling ducts 312*a* and 312*b* that are configured to interact with cooling ducts 302*a* and 302*b*, respectively on the Qi-type coil module 200 to provide cooling airflow to one or both of the Qi-type coil module 200 as well as electronic devices (e.g., phones) interacting with the Qi-type coil module 200. For example, in the embodiment shown in FIG. 4B the outlet of cooling ducts 312A and 312B are located on the outer periphery of the electronics module 204 and are aligned with the inlet to cooling ducts 302A and 302B, respectively, located on the Qi-type coil module 200. In this embodiment, the outlet of cooling ducts 302A and 302B is also located on the outer periphery of the Qi-type coil module 200 as shown in the top view of the module provided in FIG. 4A. In some embodiments, a fan 310 is located adjacent to the electronics module 204. Cooling ducts 312*a* and 312*b* formed in the electronics module 204 are configured to interact with cooling ducts 312*a* and 312*b*, respectively. In addition, cooling ducts 312*a* and 312*b* are configured to interact with cooling ducts on other types of coil modules (as shown in FIGS. 5A and 5B).

Figure 5A:
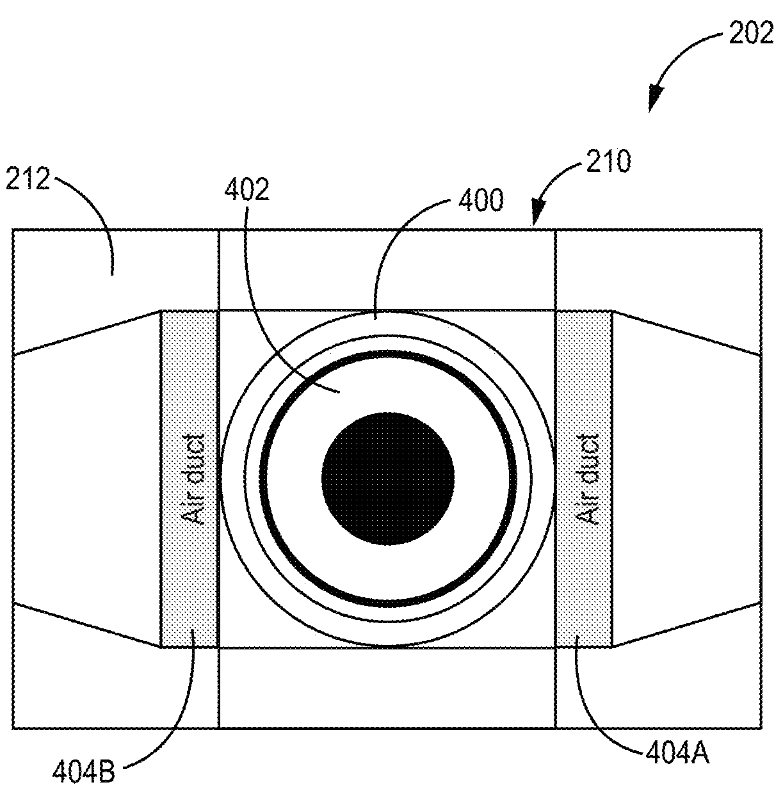
FIG. 5A is a top view of a modular magnetic wireless charging transmitter with cooling vents according to some embodiments.
Figure 5B:
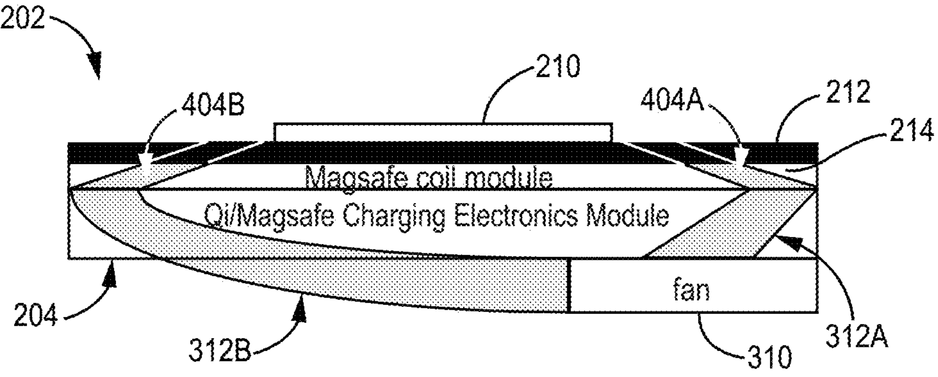
FIG. 5B is a side view of a modular magnetic wireless charging transmitter with cooling vents according to some embodiments.

FIG. 5A is a top view of a MagSafe® coil module 202 and FIG. 5B is a side view the MagSafe® coil module 202 mounted on the electronics module 204. In the embodiment shown in FIG. 5A, MagSafe® coil module 202 includes an elevated portion 210 that houses a single coil 402 and a magnetic ring 400 located concentrically around the single coil 402. Magnetic ring 400 is configured to interact with a magnet located on the electronic device (e.g., phone) to be charged, ensuring the electronic device is precisely located with respect to the single coil 402. The rubberized portion 212 and housing portion 214 have approximately the same surface area as the electronics module 204. In some embodiments, the rubberized portion 212 and housing portion 214 includes cooling ducts 404*a* and 404*b* configured to provide cooling airflow adjacent to the elevated portion 210. As shown in FIG. 5B, cooling ducts 404*a* and 404*b* are configured to receive cooling airflow from cooling ducts 312*a* and 312*b*, respectively, and to direct the cooling airflow provided by fan 310 toward the elevated portion 210 as desired.

FIG. 6 is a circuit diagram of electrical components housed within the electronics module according to some embodiments. In the embodiment shown in FIG. 6, the electronics module 204 includes an input power interface 600, output power interface 602, verification interface 604, fan interface 606, microcontroller 608, buck-boost converter 610, inverter 612, and near field communication (NFC) microprocessor 614. In addition, the electronics module 204 includes controller area network (CAN) bus 622, local interconnect network (LIN) bus 624, secure element 626, five (5) volt buck converter 628, 5V low-dropout regulator (LDO) 630, 3.3V LDO 632, demodulator 634, and multiplexer 636.

In some embodiments, direct current (DC) power is provided to the input power interface 600 of the electronics module 204. Input DC power is converted to a desired AC output by the combination of buck-boost converter 610 and inverter 612 for provision to coils within the respective coil modules 200 or 202. In some embodiments, DC power provided at input power interface 600 is also communicated (via DC bus 616) to DC converters and voltage regulators to generate the DC power required to operate microcontroller 608 and near-field controller (NFC) microcontroller 614. For example, 5V buck converter 628 and 3.3V LDO is utilized to supply power to both microcontroller 608 and to NFC microcontroller 614. In some embodiments, the DC input provided to input power interface 600 is derived from the DC bus/battery of an automobile (e.g., 12.6V, typically). In some embodiments, 5V buck converter 628 and 3.3V LDO 632 are utilized to supply power to both microcontroller 608 and NFC microcontroller 614. In some embodiments, 5V LDO 630 is utilized to provide additional power to NFC microcontroller 614. In some embodiments, DC power provided at input power interface 600 is also provided via DC bus 616 to fan 310 via fan interface 606. In some embodiments, fan interface 606 also receives control instructions from microcontroller 608 via fan interface 606. In this way, microcontroller 608 may selectively turn fan 310 On/Off. In some embodiments, microcontroller 608 communicates with systems external to electronics module 204 via CAN bus 622 and LIN bus 624 connected to input power interface 600.

In some embodiments, electronics module 204 includes output power interface 602 and verification interface 604, both of which are configured to interact with respective terminals located on the selected coil module (e.g., Qi-type coil module 200, MagSafe® coil module 204). As described above, output power interface 602 and/or verification interface 604 may include a pogo pin style interface, with copper pads on one part and spring pins on the other part. In other embodiments, the interface includes a pin-header style, wherein the connector housing may be integral to the plastic housing of the modules. For example, in the embodiment shown in FIG. 6 the output power interface 602 includes three pairs of terminals 644*a*, 644*b*, and 644*c*. In some embodiments, the number of terminals and layout of the terminals included in output power interface 602 is selected to allow the electronics module 204 to connect and selectively provide power to a plurality of different types of coil modules. For example, as described in more detail with respect to FIGS. 7A (illustrating a Qi-type coil module 200) and 7B (illustrating a MagSafe® coil module 202) each include input interface 700 and 710, respectively, configured to mate with the output power interface 602. In some embodiments, input interfaces 700 and 710 each include three terminal pairs arranged to interact with the terminal pairs 644*a*, 644*b*, and 644*c*. However, while each of the three terminal pairs is connected to a respective coil 300A, 300B, and 300C in the Qi-type coil module 200 shown in FIG. 7A, only one of the terminal pairs is utilized in the MagSafe® coil module 202 shown in FIG. 7B. Likewise, verification interface 604 is configured to mate with a verification interface located on the coil module (such as verification interfaces 702 and 712 shown in FIGS. 7A and 7B, respectively). In some embodiments, the verification interface 604 may include exposed copper printed-circuit board (PCB) patterns (like those used for push-buttons) on either the electronics module, coil module, or both in combination with electrically conductive material on the mating part, wherein upon connecting one of the respective coil modules 200 or 202 to the electronics module 204, the electrically conductive material on the mating part connects the separate contacts in the printed circuit board (PCB) pattern. This connection made across the PCB pattern may then be detected by the electronics module 204 as a part of verification regarding the type of coil module connected. In other embodiments, rather than mechanical pins, the electronics module 204 may include a near-field controller (NFC) microcontroller 614 that is configured to wirelessly communicate with tag detection circuits (e.g., tag detection circuits 704 and 714 shown in FIGS. 7A, 7B, respectively). In some embodiments, the tag detection circuits communicate the identity of the type of coil module connected to the electronics module 204 (e.g., Qi-type module 200 or MagSafe® module 202). The NFC microcontroller 614 communicates the identity of the coil module to the microcontroller 608.

In some embodiments, based on the identity of the coil module, microcontroller 608 controls the operation of buck-boost converter 610 and the inverter 612 to selectively deliver power to the connected coil module. In some embodiments, based on the identity of the coil module connected to the electronics module, this may include selectively providing AC power to each of the plurality of terminal pairs 644*a*, 644*b*, and 644*c* (for example, in response to attached coil module being identified as the Qi-type module shown in FIG. 7A, which includes three terminal pairs supplying power to three separate coils 300A, 300B, and 300C), or may include selectively providing AC power only to terminal pair 644*b* (for example, in response to attached coil module being identified as the MagSafe® module shown in FIG. 7B, which only includes a single coil for receiving power). In some embodiments, multiplexer 636 is utilized to selectively provide AC power to one or more of the terminal pairs 644*a*, 644*b*, and 644*c*. In other embodiments, other means may be utilized to selectively provide power to the terminal pairs 644*a*, 644*b*, and 644*c* based on the identified coil module connected to the electronics module 204. In addition, in some embodiments based on the identity of the coil module connected to the electronics module 204, microcontroller 608 selectively modifies the impedance network presented to the respective coil module. For example, this may include selecting the impedance network associated with the electronics module 204 with the impedance network associated with the identified coil module in order to maximize the transfer of power between the electronics module and the selected coil module.

In some embodiments, microcontroller 608 controls the operation of buck-boost converter 610 (to selectively modify the input voltage) and inverter 612 to generate the desired AC output power provided at output power interface 602. In some embodiments, control of buck-boost converter 610 and inverter 612 is based on the identity of the connected coil module.

FIGS. 7A and 7B are circuit diagrams of electrical connections associated with Qi-type coil module and MagSafe® coil module, respectively, according to some embodiments. The Qi-type coil module 200 shown in FIG. 7A includes an input interface 700 and a verification interface 702. The input interface 700 is configured to connect to the output power interface 602 associated with the electronics module 204. Likewise, the verification interface 702 is configured to interact with the verification interface 604 associated with the electronics module 206. In some embodiments, the input interface 700 includes a plurality of terminal pairs 716*a*, 716*b*, and 716*c* configured to receive power from the electronics module 204 and to provide the received power to energize the respective coils 300A, 300B, and 300C. In some embodiments, verification interface 702 interacts with verification interface 604 provided on the electronics module 204 and tag detection circuit 704 to provide information regarding the type of coil module connected (e.g., Qi-type coil module, MagSafe® coil module). In some embodiments, tag detection circuit 704 is configured to communicate wirelessly with NFC microcontroller 614 (shown in FIG. 6). In other embodiments, identity of the coil module 200 is determined based on the geometry of verification interface 702 (e.g., verification terminals may include electrically conductive material that selectively contacts the separate contacts on the corresponding verification interface 604 located on the electronics module 204, wherein the presence of an electrical contact identifies the connected coil module.

The MagSafe® coil module 202 shown in FIG. 7B includes an input interface 710 and a verification interface 712. The input interface 710 is configured to connect to the output power interface 602 associated with the electronics module 204. Likewise, the verification interface 712 is configured to interact with the verification interface 604 associated with the electronics module 206. That is, the input interface 710 and the verification interface 712 are identical in form to the input interface 700 and the verification interface 702 employed on the Qi-type coil module 200. Thus, both are capable of connection to the electronics module 204. In some embodiments, the input interface 710 includes a plurality of terminal pairs 718*a*, 718*b*, and 718*c*. In the embodiment shown in FIG. 7B, the coil 402 is connected only to terminal pair 718*b*, which in turn is connected to receive power from the electronics module 204. In some embodiments, verification interface 712 interacts with verification interface 604 provided on the electronics module 204 and tag detection circuit 714 to provide information regarding the type of coil module connected (e.g., Qi-type coil module, MagSafe® coil module). As discussed above, in some embodiments, tag detection circuit 714 is configured to communicate wirelessly with NFC microcontroller 614 (shown in FIG. 6). In other embodiments, identity of the coil module 202 is determined based on the geometry of verification interface 712 (e.g., verification interfaces may include electrically conductive material that selectively contacts the separate contacts on the corresponding verification interface 604 located on the electronics module 204, wherein the presence of an electrical contact identifies the connected coil module. That is, in some embodiments the geometry of the electrically conductive material associated with verification interface 712 is different than the geometry of the electrically conductive material associated with verification interface 702, wherein the difference allows the verification interface 604 to differentiate between the identities of the respective coil modules 200 and 202.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An electronics module configured to provide power to one of a plurality of different types of coil modules utilized for wireless charging, the electronics module comprising:

an input power interface configured to receive direct current (DC) power;

DC-to-AC converter circuitry configured to convert the DC power to alternating current (AC) power;

an output power interface having a first set of output pins and at least a second set of output pins configured to interface with each of the plurality of different types of coil modules, wherein AC power is provided to the first set of output pins in response to a first type of coil module being connected to the electronics module, and wherein AC power is provided to both the first and second set of output pins in response to a second type of coil module being connected to the electronics module; and a fan interface configured to provide DC power to a fan.

2. The electronics module of claim 1, further including:

a housing body including cooling ducts extending through the housing body to receive cooling airflow from the fan.

3. The electronics module of claim 2, wherein the cooling ducts include a cooling duct outlet located on an outer diameter of the electronics module.

4. The electronics module of claim 1, wherein the first type of coil module includes a first housing body and the second type of coil module includes a second housing body, each of the first housing body and the second housing body including cooling duct inlets configured to align with cooling duct outlets formed on the electronics module.

5. The electronics module of claim 4, wherein each of the first housing body and the second housing body include cooling duct outlets positioned to provide cooling airflow to the electronics module.

6. The electronics module of claim 5, wherein the first type of coil module includes a plurality of charging coils, wherein the cooling duct outlets associated with the first type of coil module are located along an outer periphery of the first housing body.

7. The electronics module of claim 6, wherein the second type of coil module includes a single charging coil, wherein the cooling duct outlets associated with the second type of coil module are located inward from the outer periphery of the second housing body.

8. A modular wireless charging transmitter assembly system, the system comprising:

an electronics module comprising:

a module input power interface configured to receive direct current (DC) power,

DC-to-AC converter circuitry configured to convert the DC power to alternating current (AC) power, and an output power interface having a first set of output pins and at least a second set of output pins, wherein AC power is provided to the first set of output pins in response to a first type of coil module being connected to the electronics module, and wherein AC power is provided to both the first and second set of output pins in response to a second type of coil module being connected to the electronics module;

one of the first type of coil module or the second type of coil module, each coil module having a coil input interface configured to connect to the output power interface to receive AC power from the electronics module; and a fan configured to receive power from the electronics module.

9. The system of claim 8, wherein the electronics module is enclosed in a housing body having cooling ducts extending through the housing body to receive cooling airflow from the fan.

10. The system of claim 9, wherein the housing body includes a first cooling duct and a second cooling duct, wherein the first cooling duct is located on a first side of the coil module and the second cooling duct is located on a second side of the coil module diametrically opposite from the first side of the coil module.

11. The system of claim 9, wherein the cooling ducts extending through the housing body are positioned between the fan and the coil module.

12. The system of claim 8, wherein the first type of coil module is enclosed in a first housing body and the second type of coil module is enclosed in a second housing body, each of the first housing body and the second housing body including cooling duct inlets alignable with cooling duct outlets formed on the electronics module.

13. The system of claim 12, wherein each of the first housing body and the second housing body include cooling duct outlets positioned to provide cooling airflow to the electronics module.

14. The electronics module of claim 13, wherein the first type of coil module includes a plurality of charging coils, wherein the cooling duct outlets associated with the first type of coil module are located along an outer periphery of the first housing body.

15. The electronics module of claim 14, wherein the second type of coil module includes a single charging coil and the second housing body includes an elevated portion, wherein the cooling duct outlets associated with the second type of coil module are located inward from the outer periphery of the second housing body and adjacent to the elevated portion.

16. A modular wireless charging system configured to provide power to one of a plurality of different types of coil modules utilized for wireless charging of a wireless charging receiver, the modular wireless charging system comprising:

a housing body including:

a top surface for receiving one of a plurality of different types of coil modules, and at least one cooling duct extending through the housing body;

an electronics module that includes input terminals for receiving direct current (DC) power and a plurality of output terminals for selectively providing alternating current (AC) power to one or more of the plurality of output terminals based on a type of coil module connected to the electronics module via the top surface of the housing body, wherein AC power delivered to the coil module provides wireless charging of electronic devices; and at least one coil module having a bottom surface configured to be placed on the top surface of the housing body and having at least one coil configured to receive AC power from the electronics module, wherein the at least one cooling duct extends through the housing body from the bottom surface of the coil module to the top surface of the housing body.

17. The modular wireless charging system of claim 16, wherein the at least one coil module includes a cooling duct configured to align with cooling ducts on the top surface of the housing body to direct cooling airflow through the at least one coil module to provide cooling to the at least one coil.

18. The modular wireless charging system of claim 17 further including a fan interface configured to provide DC power to a fan.

19. The modular wireless charging system of claim 18, wherein the fan is configured to provide the cooling airflow to the at least one cooling duct via the bottom surface of the housing body.

20. The modular wireless charging system of claim 19, wherein the fan is configured to provide the cooling airflow to the wireless charging receiver.

* * * * *